(12) United States Patent
Jo et al.

(10) Patent No.: US 11,545,512 B2
(45) Date of Patent: Jan. 3, 2023

(54) IMAGE SENSOR PACKAGE WITH UNDERFILL AND IMAGE SENSOR MODULE INCLUDING THE SAME

(71) Applicant: Samsung Electronics Co., Ltd., Suwon-si (KR)

(72) Inventors: Chajea Jo, Yongin-si (KR); Ohguk Kwon, Anyang-si (KR); Hyoeun Kim, Cheonan-si (KR); Seunghoon Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 17/154,890

(22) Filed: Jan. 21, 2021

(65) Prior Publication Data
US 2022/0045111 A1    Feb. 10, 2022

(30) Foreign Application Priority Data
Aug. 7, 2020    (KR) .......................... 10-2020-0099075

(51) Int. Cl.
*H01L 27/146* (2006.01)
*H04N 5/225* (2006.01)

(52) U.S. Cl.
CPC .................. *H01L 27/14618* (2013.01); *H01L 27/14609* (2013.01); *H01L 27/14623* (2013.01); *H04N 5/2254* (2013.01); *H01L 27/14643* (2013.01)

(58) Field of Classification Search
CPC ......... H01L 27/14618; H01L 27/14609; H01L 27/14623; H01L 27/14643; H01L 27/14636; H01L 27/1462; H01L 27/14625; H04N 5/2254

See application file for complete search history.

(56) References Cited

U.S. PATENT DOCUMENTS

| | | | |
|---|---|---|---|
| 6,518,656 B1 * | 2/2003 | Nakayama | H01L 27/14625 257/E31.118 |
| 8,563,350 B2 | 10/2013 | Tu et al. | |
| 9,634,059 B2 | 4/2017 | Chiu | |
| 10,249,672 B2 | 4/2019 | Fujimori et al. | |

(Continued)

FOREIGN PATENT DOCUMENTS

| | | |
|---|---|---|
| JP | 2005-252183 A | 9/2005 |
| JP | 2016-012695 A | 1/2016 |
| KR | 10-0775932 B1 | 11/2007 |

*Primary Examiner* — Albert H Cutler
(74) *Attorney, Agent, or Firm* — Muir Patent Law, PLLC

(57) ABSTRACT

An image sensor package comprises: an image sensor chip configured to convert light collected from an outside thereof into an electrical signal; a package substrate disposed under the image sensor chip the package substrate configured to process the electrical signal converted from the image sensor chip; a glass substrate disposed over the image sensor chip while being spaced apart from the image sensor chip; a seal pattern disposed between an upper surface of the package substrate and a lower surface of the glass substrate while surrounding the image sensor chip; and a protection pattern disposed on the package substrate outside the seal pattern, the protection pattern comprising a single-component material, wherein the seal pattern comprises a material different from the material of the protection pattern.

18 Claims, 16 Drawing Sheets

(56) References Cited

U.S. PATENT DOCUMENTS

| | | | |
|---|---|---|---|
| 2006/0220232 A1* | 10/2006 | Tanida | H01L 27/14625 257/723 |
| 2008/0191333 A1 | 8/2008 | Yang et al. | |
| 2011/0096219 A1 | 4/2011 | Lee et al. | |
| 2011/0207257 A1* | 8/2011 | Watanabe | H01L 27/14618 438/66 |
| 2014/0070411 A1* | 3/2014 | Okada | H01L 23/52 257/737 |
| 2017/0365632 A1* | 12/2017 | Tu | H01L 31/0203 |
| 2018/0348415 A1 | 12/2018 | Sasaki et al. | |
| 2019/0214423 A1* | 7/2019 | Kim | H01L 27/14634 |
| 2020/0162645 A1* | 5/2020 | Chen | H04N 5/2252 |

* cited by examiner

IMAGE SENSOR PACKAGE WITH UNDERFILL AND IMAGE SENSOR MODULE INCLUDING THE SAME

CROSS-REFERENCE TO THE RELATED APPLICATION

This application claims priority under 35 U.S.C. 119 to Korean Patent Application No. 10-2020-0099075, filed on Aug. 7, 2020, in the Korean Intellectual Property Office, the disclosure of which is incorporated herein by reference in its entirety.

BACKGROUND

1. Field

Exemplary embodiments of the disclosure relate to an image sensor package, an image sensor module including the same, and manufacturing methods thereof.

2. Description of the Related Art

A complementary metal oxide semiconductor (CMOS) image sensor including a photodiode is used not only in electronic appliances for general consumers such as a digital camera, a camera for a portable phone and a portable camcorder, but also in cameras mounted to vehicles, security devices and robots.

It is beneficial to develop a new structure capable of overcoming a limitation, in an image sensor package having a multi-level stacked structure, caused by a gradually increasing wiring path and a limited wiring space, and securing optimized signal integrity (SI) and power integrity (PI) characteristics.

SUMMARY

The exemplary embodiments of the disclosure provide an image sensor package minimized in area and thickness, and an image sensor module including the same.

The exemplary embodiments of the disclosure also provide an image sensor package in which a glass substrate is stacked using chip-on-wafer (COW) technology, and an image sensor module including the same.

The exemplary embodiments of the disclosure additionally provide an image sensor package with minimized optical loss, and an image sensor module including the same.

According to an aspect of the present disclosure, there is provided an image sensor package. The image sensor package comprises: an image sensor chip configured to convert light collected from an outside thereof into an electrical signal; a package substrate disposed under the image sensor chip, the package substrate configured to process the electrical signal converted from the image sensor chip; a glass substrate disposed over the image sensor chip while being spaced apart from the image sensor chip; a seal pattern disposed between an upper surface of the package substrate and a lower surface of the glass substrate while surrounding the image sensor chip; and a protection pattern disposed on the package substrate outside the seal pattern, the protection pattern comprising a single-component material, wherein the seal pattern comprises a material different from the material of the protection pattern.

According to an aspect of the present disclosure, there is provided an image sensor package. The image sensor package comprises: an image sensor chip configured to convert light collected from an outside thereof into an electrical signal; a package substrate disposed under the image sensor chip and configured to process the electrical signal converted from the image sensor chip; a glass substrate disposed over the image sensor chip while being spaced apart from the image sensor chip; a seal pattern disposed between the package substrate and the glass substrate while surrounding the image sensor chip; and a protection pattern disposed on the package substrate outside the seal pattern, wherein the seal pattern comprises a first sub-pattern contacting the package substrate, and a second sub-pattern comprising a material different from a material of the first sub-pattern, the second sub-pattern contacting the glass substrate, and wherein the protection pattern has a higher adhesiveness than the first sub-pattern.

According to an aspect of the present disclosure, there is provided an image sensor module. The image sensor module comprises: a base substrate; an image sensor package disposed on the base substrate; an optical filter disposed on the image sensor package, the optical filter comprising an infrared (IR) filter; an optical system disposed on the optical filter, the optical system comprising a plurality of lenses; a bracket fixing and supporting the optical filter; and a housing fixing and supporting the optical system, wherein the image sensor package comprises an image sensor chip configured to convert light collected from an outside thereof into an electrical signal, a package substrate disposed on the base substrate and under the image sensor chip, the package substrate configured to process the electrical signal converted from the image sensor chip, a glass substrate disposed on the image sensor chip and the package substrate while having a light receiving space, a seal pattern bonding the package substrate and the glass substrate to each other while surrounding the image sensor chip, and a protection pattern disposed on the package substrate outside the sealing member, the protection pattern comprising a single-component material, wherein the seal pattern comprises a first sub-pattern contacting the package substrate, and a second sub-pattern comprising a material different from a material of the first sub-pattern, the second sub-pattern contacting the glass substrate, and wherein the seal pattern comprises a material different from the material of the protection pattern.

DETAILED DESCRIPTION OF EXEMPLARY EMBODIMENTS

Figure 1:
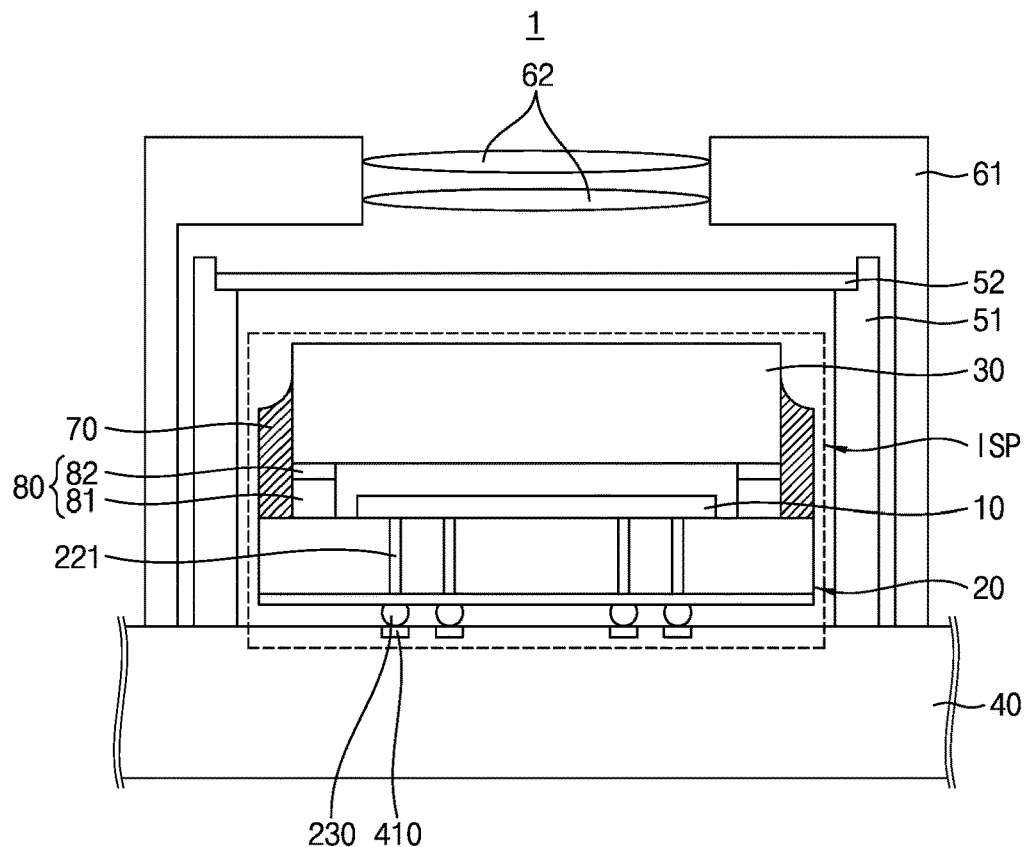
FIG. 1 is a schematic sectional view of an image sensor module according to an exemplary embodiment of the disclosure.

FIG. 1 is a schematic sectional view of an image sensor module according to an exemplary embodiment of the disclosure.

Referring to FIG. 1, an image sensor module 1 includes a base substrate 40, an image sensor package ISP, a bracket 51, an optical filter 52, a housing 61, and an optical system 62.

The base substrate 40 may be a base member of the image sensor module 1. In an embodiment, the base substrate 40 may be selected from a printed circuit board (PCB), a flexible PCB, a silicon-based substrate, a ceramic substrate, a glass substrate, and an insulating circuit board. According to embodiments of the disclosure, the base substrate 40 may include or may be formed of, as a reinforcing plate, a thermally conductive metal such as copper (Cu), silver (Ag), gold (Au), aluminum (Al), or the like.

Although not shown, memory chips may be mounted on the base substrate 40. The memory chips may include at least one of dynamic random access memory (DRAM), static random access memory (SRAM), phase-change random access memory (PRAM), magnetoresistive random access memory (MRAM), ferroelectric random access memory (FeRAM), resistive random access memory (RRAM), flash memory, and electrically erasable programmable read-only memory (EEPROM).

The image sensor package ISP may be attached to the base substrate 40 in a chip-on-wafer (COW) bonding manner. The image sensor package ISP may be electrically connected to the base substrate 40.

For example, the image sensor package ISP may include bumps 230 at a lower portion (e.g., at a bottom surface) thereof. The base substrate 40 may include substrate pads 410 at an upper surface thereof. The bumps 230 may be connected to the substrate pads 410, respectively. The image sensor package ISP and the base substrate 40 may be electrically connected to each other by the bumps 230 and the substrate pads 410.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

In an embodiment, the image sensor package ISP may include an image sensor chip 10, a package substrate 20, a glass substrate 30, a plurality of bumps 230, a sealing member 80, and a protective member 70. The image sensor package ISP will be described in detail later with reference to FIGS. 2 and 3.

In an embodiment, the bracket 51 may be formed to surround the image sensor package ISP. The bracket 51 may have a shape corresponding to a shape of the image sensor package ISP. For example, the bracket 51 may have a rectangular shape. The image sensor package ISP may be disposed within the bracket 51. The bracket 51 may be disposed outside the substrate pads 410. The bracket 51 may extend upwards from the base substrate 40.

In an embodiment, the optical filter 52 may be disposed on the image sensor package ISP while being spaced apart from the image sensor package ISP by a predetermined distance. For example, the optical filter 52 may be disposed above the image sensor package ISP. The optical filter 52 may include or may be an infrared (IR) filter. For example, the optical filter 52 may be an infrared cut-off filter or a heat-absorbing filter. The optical filter 52 may be supported by the bracket 51 on the base substrate 40. The optical filter 52 may be disposed on/above the image sensor package ISP by the bracket 51 such that the optical filter 52 covers the image sensor package ISP.

The optical system 62 may be disposed over/above the image sensor package ISP and the optical filter 52 in order to guide light from an object to the image sensor package ISP. In an embodiment, the housing 61 is attached to an upper portion/surface of the base substrate 40 in order to support the optical system 62. In an embodiment, the optical system 62 may include a plurality of lenses. The plurality of lenses may be arranged to overlap with one another in a vertical direction. The optical system 62 may focus light from an object on the image sensor package ISP. The optical system 62 may be fixed and supported by the housing 61.

In an embodiment, the housing 61 may be disposed on the base substrate 40 outside the bracket 51. In some embodiments, the housing 61 may be disposed on the bracket 51.

Figure 2:
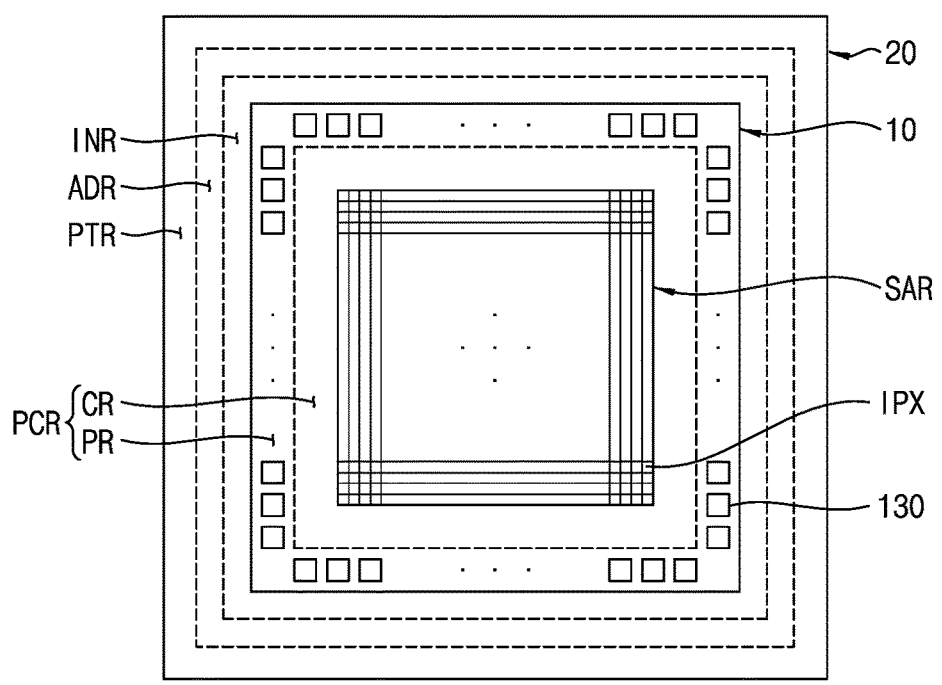
FIG. 2 is a schematic projected top view of the image sensor package according to the exemplary embodiment of the disclosure.

FIG. 2 is a schematic projected top view of the image sensor package according to the exemplary embodiment of the disclosure. FIG. 2 shows upper surfaces of the package substrate 20 and the image sensor chip 10 in the image sensor package ISP.

Referring to FIG. 2, the image sensor chip 10 may have a smaller area than the package substrate 20, and may be disposed inside the package substrate 20 in a plan view.

In an embodiment, the image sensor chip 10 may include an image sensor. For example, the image sensor chip 10 may include a complementary metal oxide semiconductor (CMOS) image sensor. The image sensor may convert light collected from the outside thereof into an electrical signal.

The image sensor chip 10 may include a sensor array region SAR and a peripheral circuit region PCR. Here, the peripheral circuit region PCR may include a circuit region CR and a pad region PR.

A pixel array constituted by a plurality of unit pixels IPX arranged in a matrix is formed in the sensor array region SAR. For example, the plurality of unit pixels IPX may be arranged in plural rows and plural columns. For example, each of the plurality of unit pixels IPX may include a passive pixel sensor or an active pixel sensor. For example, each of the plurality of unit pixels IPX may include a photodiode to sense light, a transfer transistor to transfer charges generated by the photodiode, a floating diffusion region to store the transferred charges, a reset transistor to periodically reset the floating diffusion region, and a source follower to buffer a signal according to the charges stored in the floating diffusion region. For example, the source follower may be a common-drain amplifier.

The circuit region CR may be disposed along an edge of the sensor array region SAR. For example, the circuit region CR may surround the sensor array region SAR and positioned directly adjacent to the sensor array region SAR. In some embodiments, the circuit region CR may be disposed to overlap with the sensor array region SAR in a vertical direction at a lower portion of the sensor array region SAR. For example, electronic elements and/or wiring structures of the circuit region CR may overlap with the sensor array in the vertical direction. For example, the circuit region CR may be constituted by electronic elements including a plurality of transistors. The circuit region CR may include a wiring structure for providing signals and/or controlling output signals.

The pad region PR may be disposed around the sensor array region SAR. In an embodiment, the pad area PR may be disposed along an outer edge of the circuit region CR. For example, the pad area PR may surround the circuit region CR and positioned directly adjacent to the circuit region CR. In the pad region PR, a plurality of conductive pads 130 used to transmit or receive electrical signals to or from an external device or the package substrate 20 may be disposed.

According to embodiments of the disclosure, each conductive pad 130 may be exposed at an upper surface of the image sensor chip 10. Each conductive pad 130 may be electrically connected to a plurality of unit pixels IPX. For example, each conductive pad 130 may be made of metal, a metal nitride, or a combination thereof.

The image sensor chip 10 may include a plurality of wiring structures (not shown) to electrically connect the plurality of conductive pads 130 to the electronic elements included in the circuit region CR and the plurality of unit pixels IPX included in the sensor array region SAR. For example, the electronic elements may be transistors, diodes, resistors, etc. The plurality of wiring structures may be made of metal, a metal nitride, or a combination thereof.

In an embodiment, the package substrate 20 may include a sealing region ADR, a protective region PTR, and an inner region INR.

Referring to FIGS. 1 and 2, the sealing region ADR may be defined as a region where the sealing member 80 is disposed for attachment of the glass substrate 30 to the package substrate 20. For example, the sealing member 80 may be a seal pattern disposed between the glass substrate 30 and the package substrate 20 sealing inner space in which the image sensor chip 10 is disposed to separate the inner space from the outside. In an embodiment, the sealing region ADR may surround an outside of the image sensor chip 10 while being spaced apart from the image sensor chip 10 by a predetermined distance. On the package substrate 20, both a region including the image sensor chip 10 and a region forming a predetermined spacing between the sealing region ADR and the image sensor chip 10 may be defined as the inner region INR.

The protective region PTR may be defined as a region where the protective member 70 is disposed. The protective region PTR may be disposed to surround an outside of the sealing region ADR while being disposed on an edge of the package substrate 20.

Figure 3:
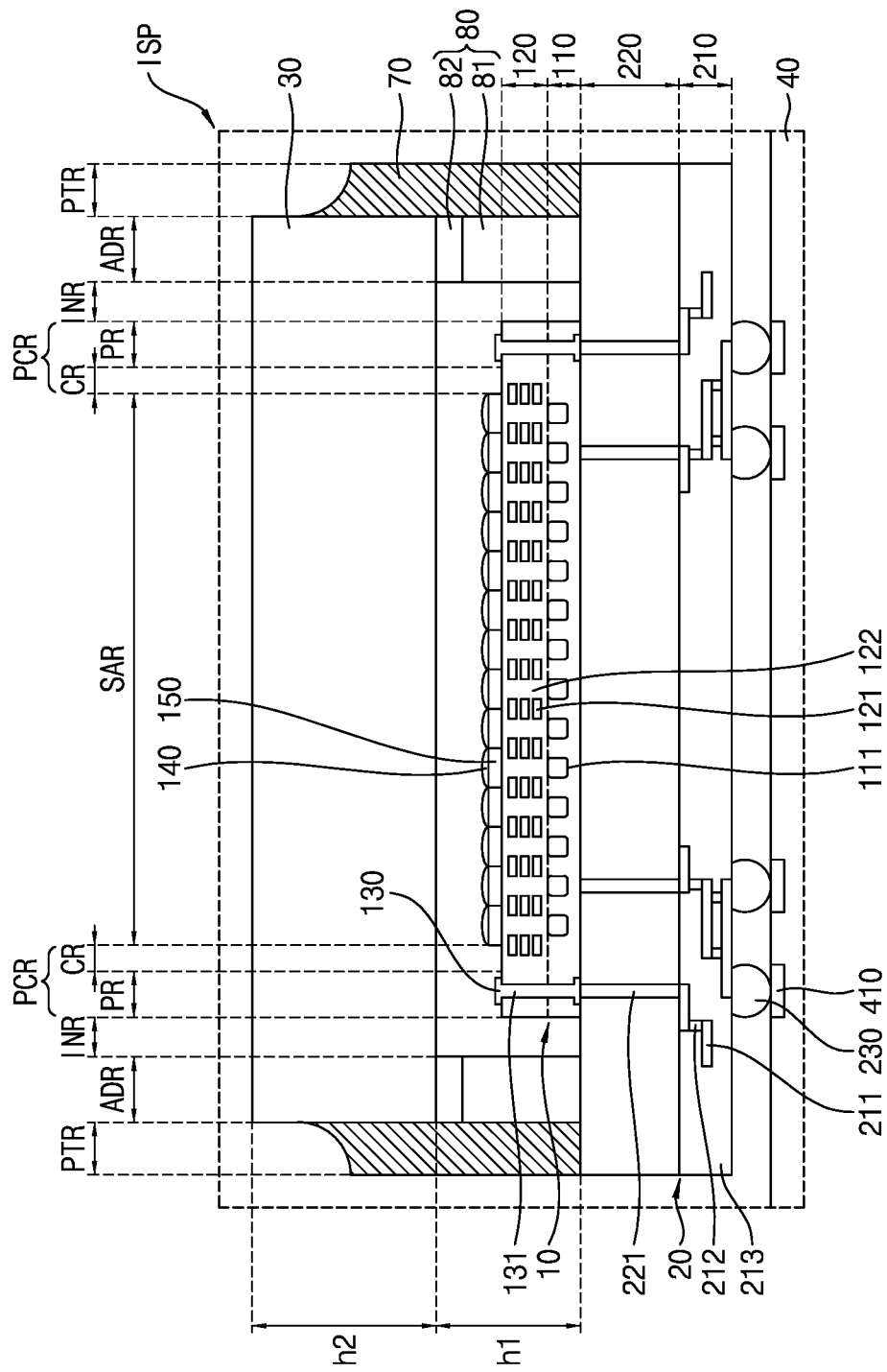
FIG. 3 is a schematic sectional view of the image sensor package according to the exemplary embodiment of the disclosure.

FIG. 3 is a schematic sectional view of the image sensor package according to the exemplary embodiment of the disclosure.

Referring to FIGS. 2 and 3, the image sensor chip 10 may be disposed on the package substrate 20. In an embodiment, the image sensor chip 10 may include a photoelectric transformation element layer 110, an intermediate wiring layer 120, a plurality of color filters 150, and a plurality of microlenses 140.

The photoelectric transformation element layer 110 may be or may correspond to a layer including a photoelectric transformation element 111. The photoelectric transformation element 111 may be disposed within the sensor array region SAR. The photoelectric transformation element 111 may be disposed per unit pixel IPX. For example, the photoelectric transformation element layer 110 may include a plurality of photoelectric transformation elements 111 and each transformation element 111 may be disposed in a corresponding unit pixel IPX. The photoelectric transformation element 111 may include a plurality of impurity regions (not shown) doped with n-type impurities or p-type impurities. In an embodiment, the photoelectric transformation element 111 may be configured in the form of a photodiode. For example, the photoelectric transformation elements 111 may be photodiodes.

The photoelectric transformation element layer 110 may include an n-type or p-type epitaxial layer at a portion thereof where the photoelectric transformation element 111 is not disposed. In the n-type or p-type epitaxial layer, an n-type deep well may be formed through ion implementation of n-type impurities in a high concentration, or a p-type deep well may be formed through ion implementation of p-type impurities in a high concentration.

The intermediate wiring layer 120 may be disposed on the photoelectric transformation element layer 110. The intermediate wiring layer 120 may include a wiring structure. In an embodiment, the intermediate wiring layer 120 may include a plurality of metal layers 121 constituting the wiring structure, and an insulating layer 122 disposed among the plurality of metal layers 121. In certain embodiments, the intermediate wiring layer 120 may include two or more insulating layers 122 respectively formed between the metal layers 121.

For example, the plurality of metal layers 121 may include or may be formed of a metal such as copper (Cu), aluminum (Al) and a tungsten (W).

For example, the insulating layer 122 may include a high-density plasma (HDP) oxide film, a tetraethoxysilane (TEOS) oxide film, Tonen silazene (TOSZ), spin-on-glass (SOG), undoped silica glass (USG), or a low-k dielectric layer.

In an embodiment, the wiring structure including the plurality of metal layers 121 may not vertically overlap with the photoelectric transformation element 111. In an exemplary embodiment of the disclosure, light incident upon the image sensor may reach the photoelectric transformation element 111 through a region where the wiring structure is not disposed.

The plurality of color filters 150 may be disposed on the intermediate wiring layer 120. The plurality of color filters 150 may be disposed within the sensor array region SAR. The plurality of color filters 150 may be disposed per unit pixel IPX. For example, each unit pixel IPX may include a corresponding color filter 150. In an embodiment, the plurality of color filters 150 may include a red filter, a blue filter and a green filter. In some embodiments, the plurality of color filters 150 may include a cyan filter, a yellow filter and a magenta filter.

The plurality of microlenses 140 may be disposed on the plurality of color filters 150, respectively. Each microlens 140 may focus, on each unit pixel IPX, light incident upon the sensor array region SAR. For example, when each unit pixel IPX includes a photodiode, each microlens 140 may focus, on the photodiode of each unit pixel IPX, light incident upon the unit pixel in the sensor array region SAR.

The image sensor chip 10 may be embodied as a front-side illumination (FSI) structure or a back-side illumination (BSI) structure. For example, the intermediate wiring layer 120 may be disposed between the photoelectric transformation element layer 110 and color filters 150 in the FSI structure, and the photoelectric transformation element layer 110 may be disposed between the wring layer 120 and the dolor filters 150 in the BSI structure. In the exemplary embodiment of the disclosure, description will be given in conjunction with an example in which the image sensor chip 10 has a front-side illumination (FSI) structure.

In an embodiment, the plurality of conductive pads 130 may be electrically connected to the package substrate 20 while passing through the photoelectric transformation element layer 110 and the intermediate wiring layer 120 in the pad area PR. For example, the plurality of conductive pads 130 may be electrically connected to the package substrate 20 via through-silicon via (TSV) contacts 131 extending vertically through the photoelectric transformation element layer 110 and the intermediate wiring layer 120. For example, the package substrate 20 may include a silicon substrate, and the TSV contacts 131 may be formed through the silicon substrate of the package substrate 20. The image sensor chip 10 may output electrical signals to the package substrate 20 through the conductive pads 130 and/or through the TSV contacts 131. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The package substrate 20 may be disposed under the image sensor chip 10. In an embodiment, the image sensor chip 10 and the package substrate 20 may be attached to each other through a wafer-to-wafer bonding process. According to embodiments of the disclosure, the image sensor chip 10 and the package substrate 20 (for example, a plurality of image sensor chips 10 and a single mother package substrate 20a (cf. FIG. 6)) may be attached to each other to face each other and, as such, a unit assembly thereof may be fabricated.

In an embodiment, the package substrate 20 may include a re-distribution layer 210 and a wiring structure layer 220.

The wiring structure layer 220 may be disposed on the re-distribution layer 210. The wiring structure layer 220 may process a signal output from the image sensor chip 10. The wiring structure layer 220 may include a wiring structure constituted by various logic circuits including analog intellectual property (IP), etc. such as digital signal processor (DSP), processor core IP, analog-to-digital converter (ADC), digital-to-analog converter (DAC), or phase-locked loop (PLL). In addition, the wiring structure layer 220 may further include an insulating film for insulating wiring structures from each other.

In an embodiment, the package substrate 20 may include a plurality of TSV contacts 221 formed in the package substrate 20. The plurality of TSV contacts 221 may extend/penetrate the wiring structure layer 220 in a vertical direction. One end of each TSV contact 221 may be formed to be exposed at an upper surface of the package substrate 20, and the other end of each TSV contact 221 may be electrically connected to a re-distribution line 221 in the re-distribution layer 210. At least a part of the plurality of TSV contacts 221 may be electrically connected to the plurality of conductive pads 130 formed in the image sensor chip 10.

According to embodiments of the disclosure, the re-distribution layer 210 may have a multilayer structure. In this case, the re-distribution layer 210 may include a plurality of re-distribution lines 211, and re-distribution vias 212 vertically connecting the re-distribution lines 211 disposed at different levels from among the plurality of re-distribution lines 211. For example, the re-distribution lines 211 may extend horizontally. In addition, the re-distribution layer 210 may further include a re-distribution insulating layer 213 formed throughout the entire portion of the re-distribution layer 210 including portions of the re-distribution layer 210 among the plurality of re-distribution lines 211.

The re-distribution lines 211 and the re-distribution vias 212 may be made of metal, a metal nitride, or a combination thereof. For example, the re-distribution lines 211 and the re-distribution vias 212 may be made of W, Cu, Zr, Ti, Ta, Al, Ru, Pd, Pt, Co, Ni, a nitride thereof, or a combination thereof.

For example, the re-distribution insulating layer 213 may include a passivation material, for example, polyimide (PI). For example, the re-distribution insulating layer 213 may include a passivation layer, e.g., formed of a shielding material to protect underlying layer/pattern, at the bottom of the insulating layer 213. In another example, the re-distribution insulating layer 213 may include benzocyclobutene (BCB), polybenzoxazole, epoxy, a silicon oxide, a silicon nitride, or a combination thereof. In certain embodiments, the re-distribution insulating layer 213 may be formed of the passivation material, e.g., a non-reactive material like an oxide or a nitride.

The bumps 230 may be disposed at a lower portion/bottom surface of the package substrate 20. Each bump 230 may be electrically connected to at least one re-distribution line 211. Each bump 230 may contact substrate pads 410 formed at an upper surface of the base substrate 40.

The glass substrate 30 may be disposed over/above the package substrate 20 and the image sensor chip 10. The glass substrate 30 may be made of a transparent material such as glass and, as such, may transmit light therethrough. The glass substrate 30 may be disposed on the image sensor chip 10 such that the glass substrate 30 faces the plurality of microlenses 140 included in the image sensor chip 10. A light receiving space may be provided between the image sensor chip 10 and the glass substrate 30. For example, there may be a gap between the image sensor chip 10 and the glass substrate 30. For example, the gap may be filled with air or a gas. The glass substrate 30 may be fixed on the package substrate 20 by the sealing member 80. In an embodiment, the glass substrate 30 has a thickness h2 of about 300 to 1,000 μm. Thickness may refer to the thickness or height measured in a direction perpendicular to a top surface of the substrate.

In an embodiment, the sealing member 80 may be formed on the package substrate 20. The sealing member 80 is disposed between the package substrate 20 and the glass substrate 30 such that the sealing member 80 contacts the package substrate 20 at a lower surface thereof while contacting the glass substrate 30 at an upper surface thereof, thereby sealing the image sensor chip 10 and the light receiving space from an outside thereof. In addition, the image sensor chip 10 may minimize optical loss by disposing the protective member 70 together with the sealing member 80 at the outside of the sensor array region SAR. For example, the protective member 70 may be a protection pattern protecting the image sensor chip 10 by supporting adhesion between the glass substrate 30 and the package substrate 20 along with the seal pattern 80.

In an embodiment, the sealing member 80 may include a first sub-member 81 and a second sub-member 82 which include different materials, respectively. For example, the sealing member 80 may be a seal pattern and the first sub-member 81 and the second sub-member 82 may be a first sub-pattern 81 and a second sub-pattern 82 of the seal pattern 80.

In an embodiment, the first sub-member 81 may constitute a lower portion of the sealing member 80 contacting the package substrate 20. For example, the first sub-member 81 may include a surface of the sealing member 80 contacting the package substrate 20.

The first sub-member 81 may be a gap-fill material. For example, the first sub-member 81 may be formed by a gap-fill process. In an embodiment, the first sub-member 81 may be a pattern adhesive. For example, the pattern adhesive may be an adhesive having a predetermined pattern in advance, and the patterned adhesive may be attached on a surface of the second sub-member 82. For example, the first sub-member 81 may include or may be formed of a curable polymer having adhesiveness, an epoxy-based polymer, a photosensitive material, or an optically clear adhesive (OCA). For example, the curable polymer may be a UV curable resin or a thermally curable resin.

In an embodiment, the second sub-member 82 may constitute an upper portion of the sealing member 80 contacting the glass substrate 30. For example, the second sub-member 82 may include a surface of the sealing member 80 contacting the glass substrate 30.

In an embodiment, the second sub-member 82 may include or may be formed of a metal. For example, the second sub-member 82 may include or may be formed of W, Cu, Zr, Ti, Ta, Al, Ru, Pd, Pt, Co, or Ni.

In an embodiment, the sealing member 80 has a thickness h1 of about 10 to 50 μm. According to embodiments of the disclosure, the thickness of the second sub-member 82 may be greater than the thickness of the first sub-member 81. In an embodiment, the width of the sealing member 80 may be about 30 to 70 μm.

The protective member 70 may be formed to surround an outer edge of the sealing member 80. In an embodiment, the protective member 70 is formed to extend from the upper surface of the package substrate 20 up to a predetermined level such that the protective member 70 surrounds an edge of the glass substrate 30. For example, the protective member 70 may contact side surfaces of the glass substrate 30. In an embodiment, the protective member 70 may have a maximum height equal to or higher than the height (thickness) of the sealing member 80, but equal to or lower than the height of the upper surface of the glass substrate 30 with reference to the upper surface of the package substrate 20. In an embodiment, the width of the protective member 70 may be about 30 to 70 μm.

The protective member 70 may include a material different from those of the first sub-member 81 and the second sub-member 82. The protective member 70 may have a higher adhesiveness than the first sub-member 81. For example adhesion force between the protective member 70 and the package substrate 20 may be greater than adhesion force between the first sub-member 81 and the package substrate 20. The protective member 70 may be a gap-fill material. In an embodiment, the protective member 70 may include an underfill material. For example, the protective member 70 may be formed by a gap-fill process or an underfill process. For example, the protective member 70 may include a single-component material such as a thermosetting resin. For example, the protective member 70 may be formed of single material and may not be formed of a mixture of different materials.

In an embodiment, the protective member 70 may have capillary characteristics. For example, the protective member 70 may flow into a gap when the protective member 70 is formed on the glass substrate 30, on the sealing member 80 and on the package substrate 20. The protective member 70 may include a bent or curved region at an upper surface thereof. For example, the upper surface of the protective member 70 may have a height gradually increasing as the upper surface of the protective member 70 extends toward a portion thereof contacting the glass substrate 30 while gradually decreasing as the upper surface of the protective member 70 extends away from the glass substrate 30 (up to a predetermined distance). For example, the height of the upper surface of the protective member 70 may increase in a direction approaching the glass substrate 30, and may decrease in a direction receding from the glass substrate 30. For example, the upper surface of the protective member 70 may have an inclination gradually decreasing as the upper surface of the protective member 70 extends away from the glass substrate 30 (up to a predetermined distance). For example, the slope of the upper surface of the protective member 70 may decrease receding from the glass substrate 30. For example, the top surface of the protective member 70 may have a concave surface.

In an embodiment, an outer edge of the protective member 70 may align with an outer edge of the package substrate 20 in a vertical direction (thickness direction).

FIGS. 4 to 11 are schematic sectional views illustrating a method for manufacturing an image sensor package according to an exemplary embodiment of the disclosure.

Figure 4:
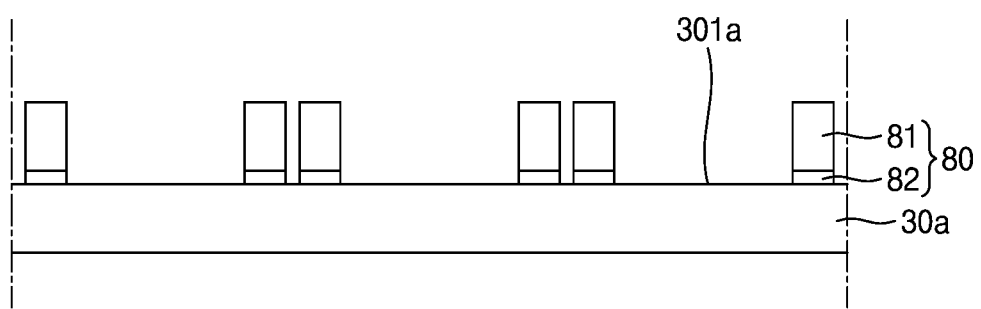
FIGS. 4 to 11 are schematic sectional views illustrating a method for manufacturing an image sensor package according to an exemplary embodiment of the disclosure.

First, referring to FIG. 4, a plurality of second sub-members 82 may be formed on one surface 301*a* of a mother glass substrate 30*a*. The mother glass substrate 30*a* may be cut into pieces of a predetermined size in a subsequent process and, as such, each piece may constitute a glass substrate 30. The one surface 301*a* of the mother glass substrate 30*a* corresponds to the lower surface of the glass substrate 30 in FIG. 3.

Although not clearly shown, according to embodiments of the disclosure, each second sub-member 82 may be formed to have a quadrangular ring shape when viewed in a plane. For example, each the second sub-member 82 may have a quadrangular loop shape. Each second sub-member 82 may include or may be formed of an opaque material, e.g., a metal, as described above. Each second sub-member 82 may include an alignment key function. For example, the second sub-members 82 may be used to align parts and/or substrates during a manufacturing process of an image sensor package or an image sensor module.

A first sub-member 81 may be formed on one surface of each second sub-member 82. Although not clearly shown, each first sub-member 81 may be formed to have a shape corresponding to each sub-member 82 in a plan view (for example, a quadrangular ring/loop shape).

Figure 5:
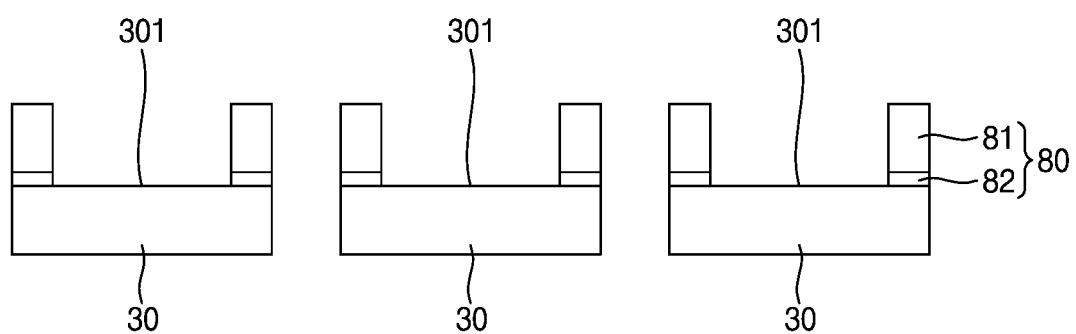

Referring to FIG. 5, the mother glass substrate 30*a* may be cut into glass substrates 30. In an embodiment, the mother glass substrate 30*a* may be cut into glass substrates 30 through a sawing process or a laser process. Correspondingly, the one surface 301*a* of the mother glass substrate 30*a* may be separated into surfaces 301 of respective glass substrates 30.

Figure 6:
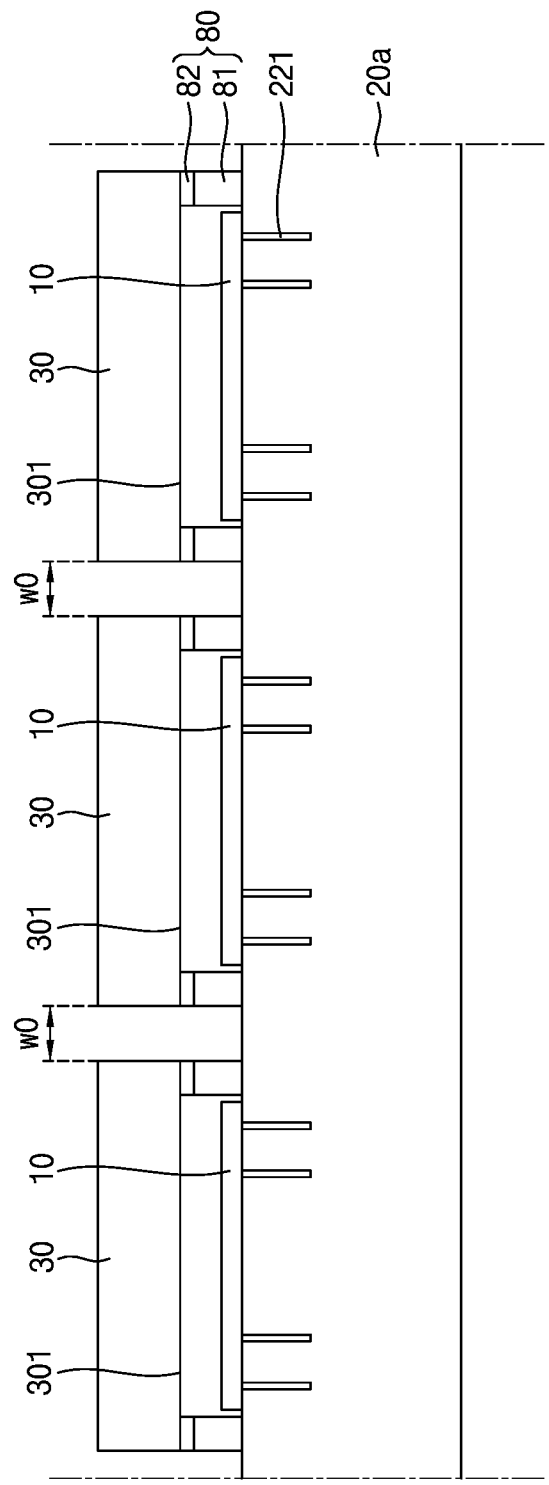

Referring to FIG. 6, each glass substrate 30 may be disposed on a mother package substrate 20*a*. The first sub-member 81 disposed on one surface of each glass substrate 30 may be attached to the mother package substrate 20*a*. Each glass substrate 30 and the sealing member 80 thereon may be disposed to cover a corresponding one of image sensor chips 10 disposed on the mother package substrate 20*a*.

In an embodiment, the glass substrates 30 may be disposed on the mother package substrate 20*a* while being spaced apart from one another by a predetermined space w0. For example, the sealing members 80 combined with the glass substrates 30 may be disposed on the mother package substrate 20*a* so that the sealing members 80 contact a surface of the mother package substrate 20*a*.

Figure 7:
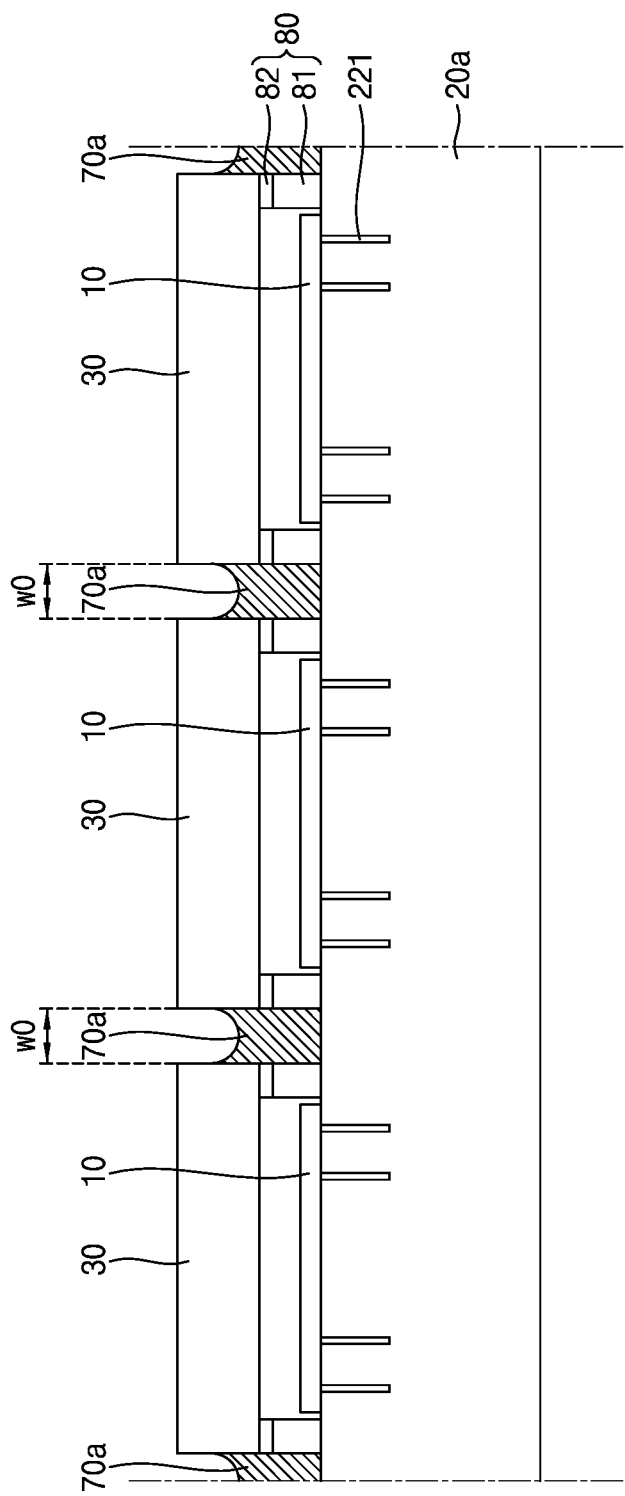

Referring to FIG. 7, an underfill material 70a may be coated in the predetermined space w0 between the adjacent glass substrates 30, and may then be cured. For example, an uppermost surface of the underfill material 70a may have a height equal to or higher than a lowermost surface of each glass substrate 30, but equal to or lower than an uppermost surface of each glass substrate 30.

The underfill material 70a has capillary characteristics and, as such, an upper surface of the underfill material 70a may have a height gradually increasing as the upper surface of the underfill material 70a extends toward a portion thereof contacting the glass substrate 30 while gradually decreasing as the upper surface of the underfill material 70a extends toward a central portion thereof. For example, the height of the upper surface of the underfill material 70a may increase in a direction approaching the glass substrate 30, and may decrease in a direction receding from the glass substrate 30.

Figure 8:
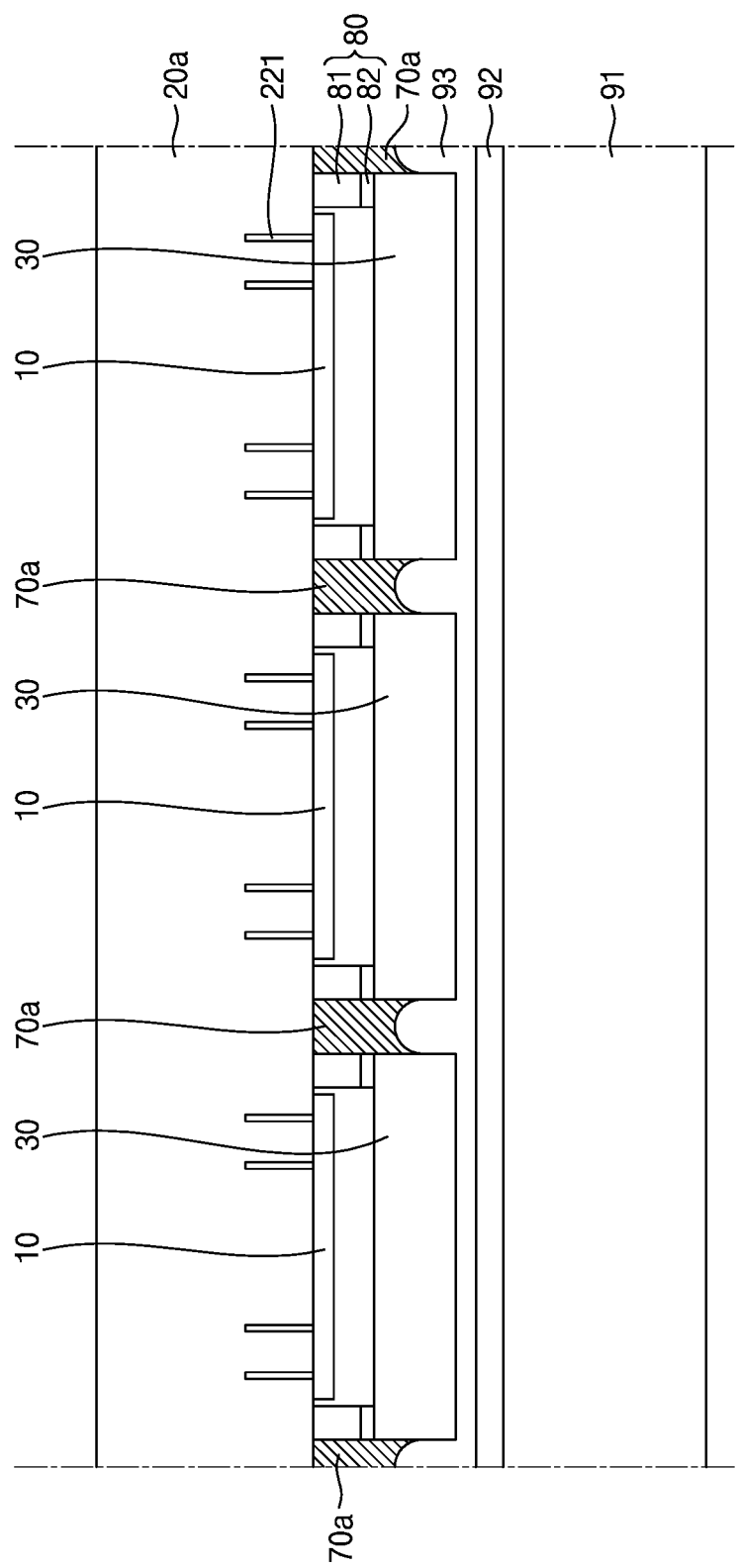

Referring to FIG. 8, each glass substrate 30 and the mother package substrate 20a may be inverted such that the glass substrate 30 is disposed below the mother package substrate 20a, and the resultant structure may then be disposed on a carrier 91.

In order to fix each glass substrate 30 and the mother package substrate 20a on the carrier 91, a photosensitive material layer 93 (for example, a layer made of a photoresist material) may be formed on each glass substrate 30, and the resultant structure may be fixed to the carrier 91 under the condition that an adhesive layer 92 is interposed between the photosensitive material layer 93 and the carrier 91. The photosensitive material layer 93 may degrade or decompose when the photosensitive material is exposed to a light having a certain wavelength. When the photosensitive material 93 is dispersed on the glass substrates 30 and on the underfill material 70a, the photosensitive material layer 93 fills a gap formed between the glass substrate 30, as such, a flat upper surface of the photosensitive material layer 93 may be formed on the glass substrates 30. After that, the carrier 91 formed with the adhesive layer 92 is disposed on the mother package substrate 20a. Accordingly, the adhesive layer 92 may be disposed on the carrier 91, the photosensitive material layer 93 may be disposed on the adhesive layer 92, and each glass substrate 30 and the underfill material 70a may be disposed on the photosensitive material 93.

Figure 9:
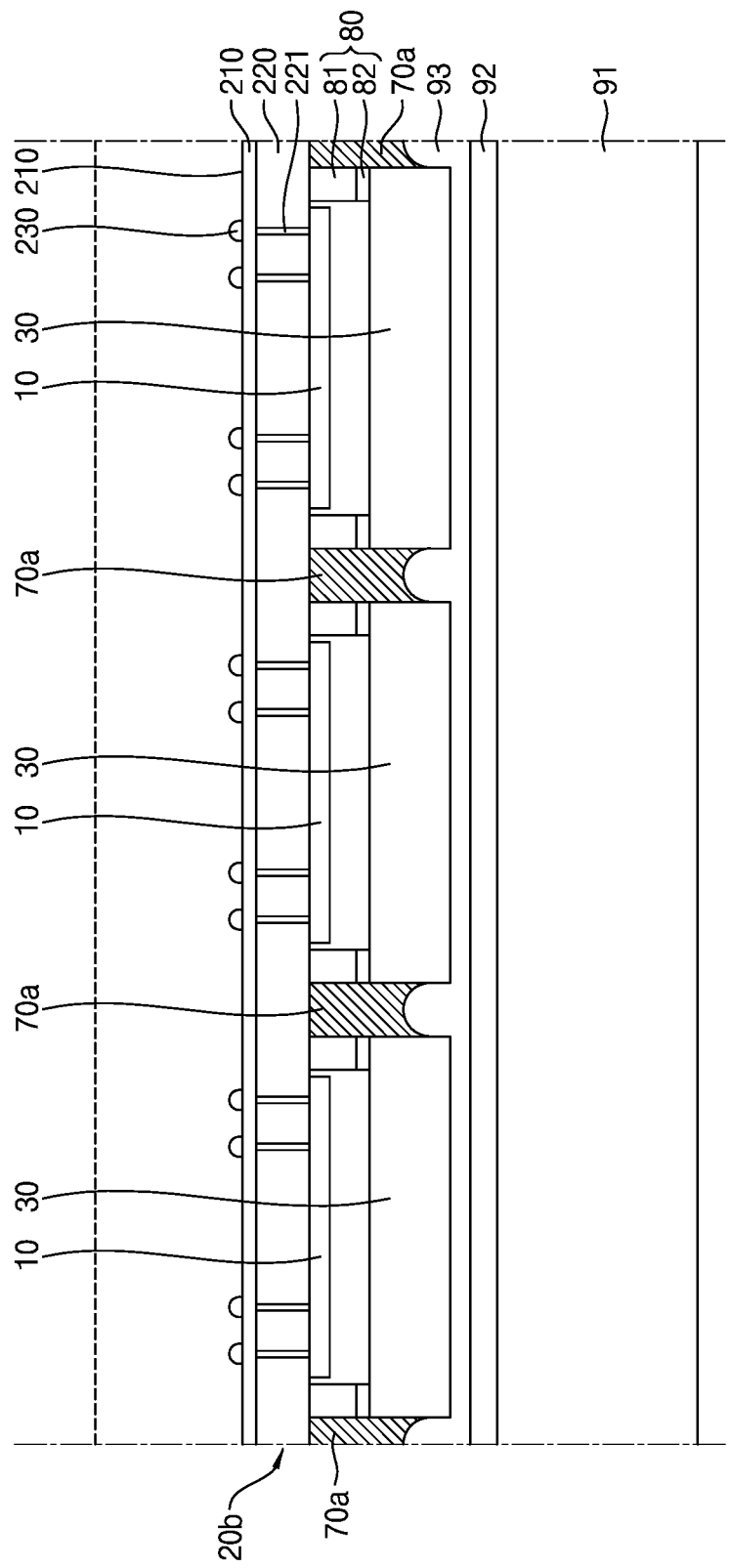

Referring to FIG. 9, a portion of the mother package substrate 20a may be removed. The remaining portion of the partially-removed mother package substrate 20a is designated by reference numeral "20b" in FIG. 9. A re-distribution layer 210 and bumps 230 may then be formed on one surface of the partially-removed mother package substrate 20b. For example, a sawing or a grinding process may be used for partial removal of the mother package substrate 20a.

Figure 10:
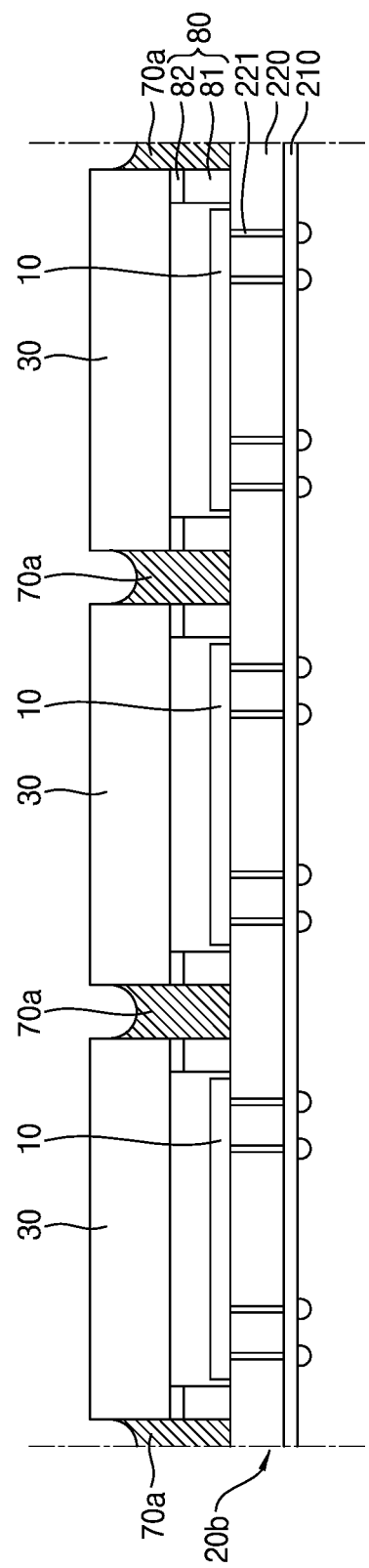

Referring to FIG. 10, each glass substrate 30 and the partially-removed mother package substrate 20b may be separated from the carrier 91, and the photosensitive material layer 93 formed on each glass substrate 30 may then be removed.

Figure 11:
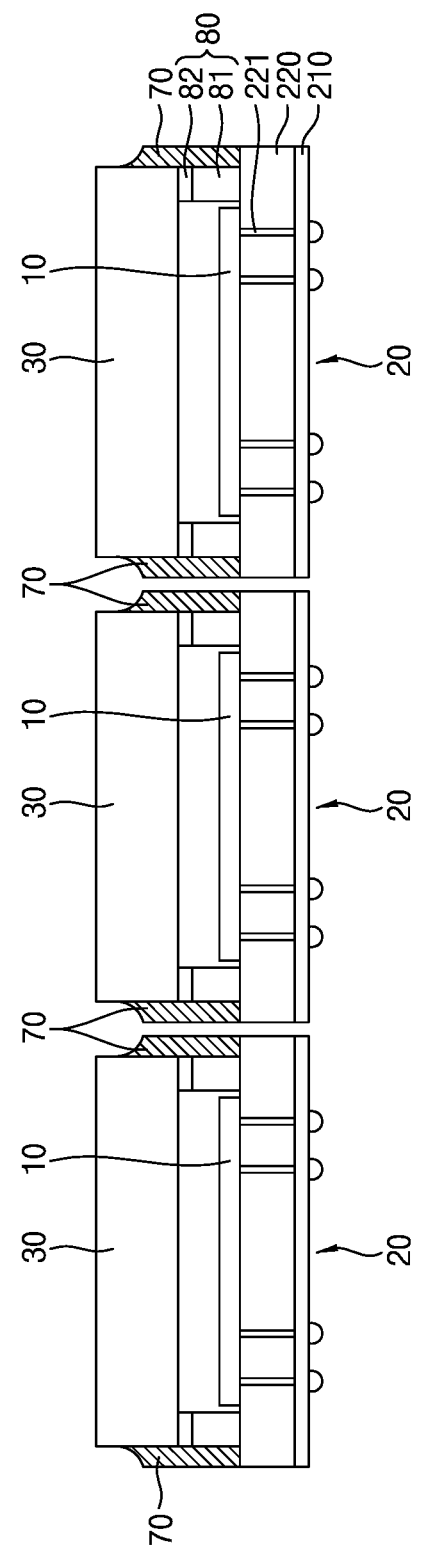

Referring to FIG. 11, the partially-removed mother package substrate 20b and the underfill material 70a may be separated to form a package substrate 20 and a protective member 70 of each image sensor package ISP. For example, the partially-removed mother package substrate 20b and the underfill material 70a may be separated in a vertical direction using a sawing process. According to embodiments of the disclosure, the underfill material 70a may be cut in a vertical direction at a central portion thereof (a portion of the uppermost surface of the underfill material 70a having a lowest height) and, as such, the partially-removed mother package substrate 20b and the underfill material 70a may be separated.

Next, image sensor packages according to other exemplary embodiments of the disclosure will be described. In the following description, no duplicated description will be given with respect to the same constituent elements as those of FIGS. 1 to 11, and the same reference numerals will be used for these constituent elements.

FIGS. 12 to 18 are sectional views of image sensor packages according to exemplary embodiments of the disclosure, respectively.

Figure 12:
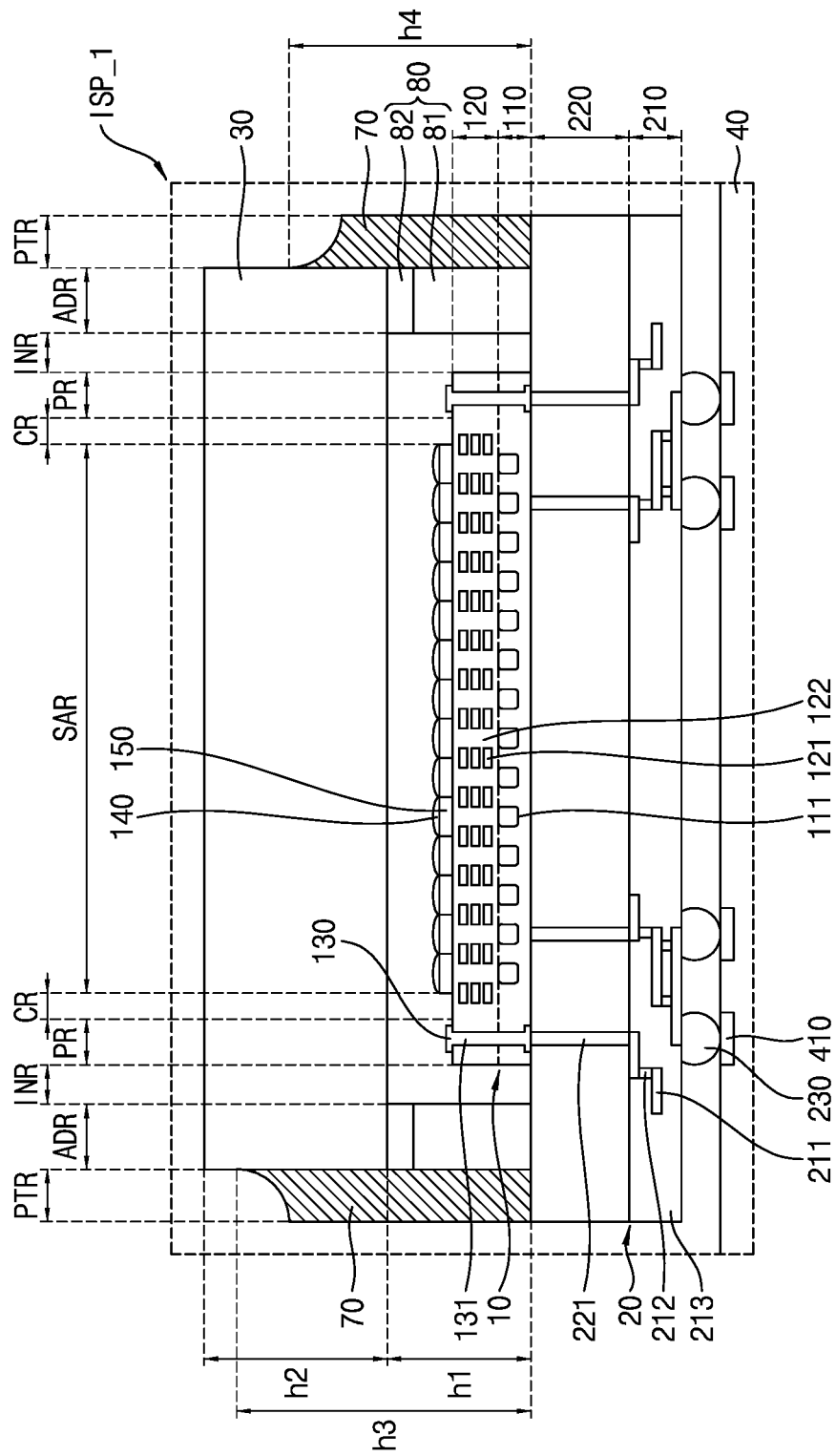
FIGS. 12 to 18 are sectional views of image sensor packages according to exemplary embodiments of the disclosure, respectively.

Referring to FIG. 12, an image sensor package ISP_1 according to the illustrated exemplary embodiment of the disclosure differs from the image sensor package ISP of FIG. 3 in that a protective member 70 has a first thickness h3 at one side thereof and a second thickness h4 at the other side thereof which differ from each other. For example, the protective member 70 may have different thickness/height on opposite sides.

Figure 13:
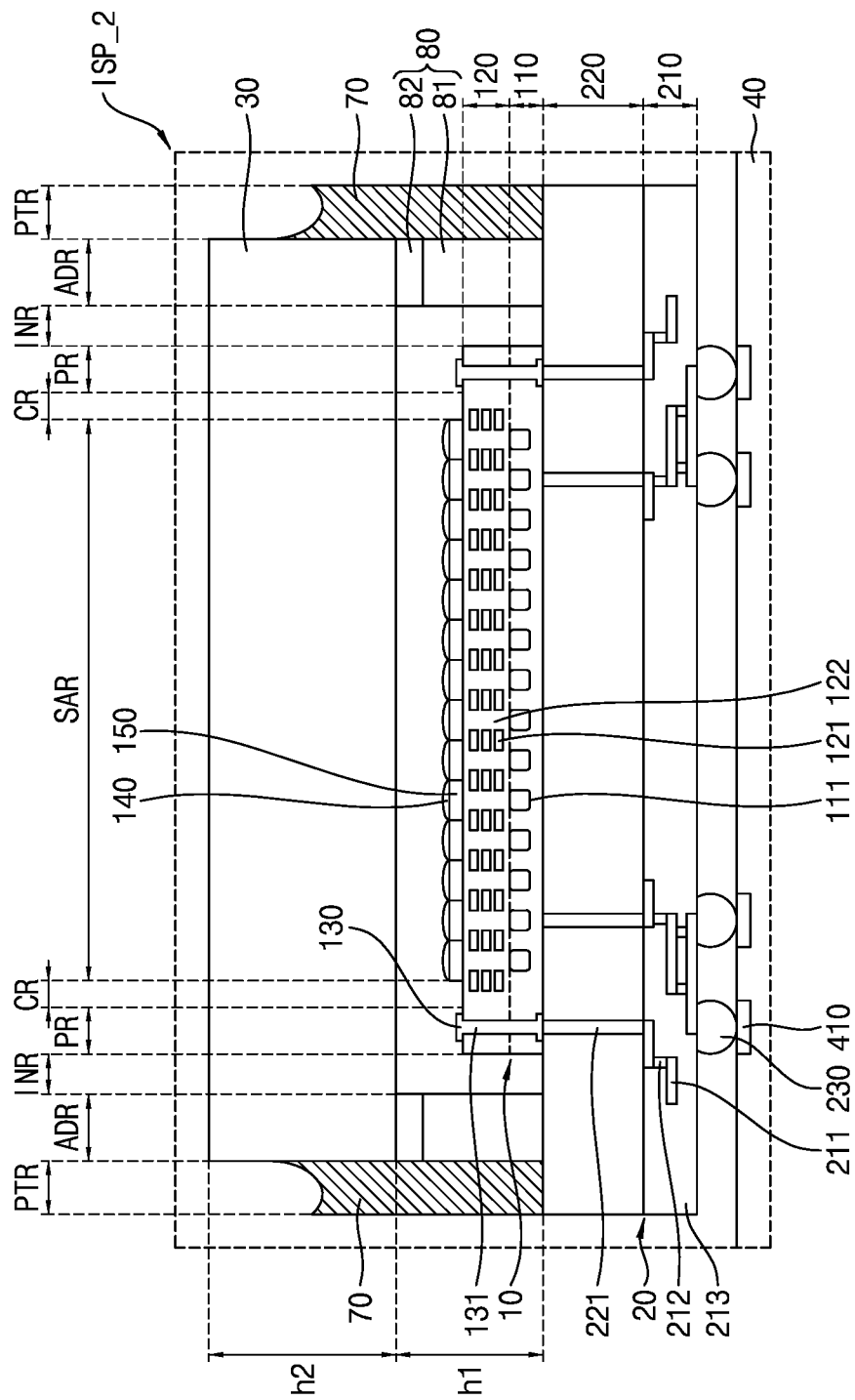

Referring to FIG. 13, an image sensor package ISP_2 according to the illustrated exemplary embodiment of the disclosure differs from the image sensor package ISP of FIG. 3 in that a lowermost point of an upper surface of a protective member 70 is not disposed at an edge of the upper surface of the protective member 70. In an embodiment, the lowermost point of the upper surface of the protective member 70 may be formed in a region adjacent to an outer edge of the upper surface of the protective member 70. For example, the upper surface of the protective member 70 may have a height gradually decreasing in a direction receding from the glass substrate 30 to a predetermined point while gradually increasing in the direction receding from the predetermined point to the outer edge thereof.

Figure 14:
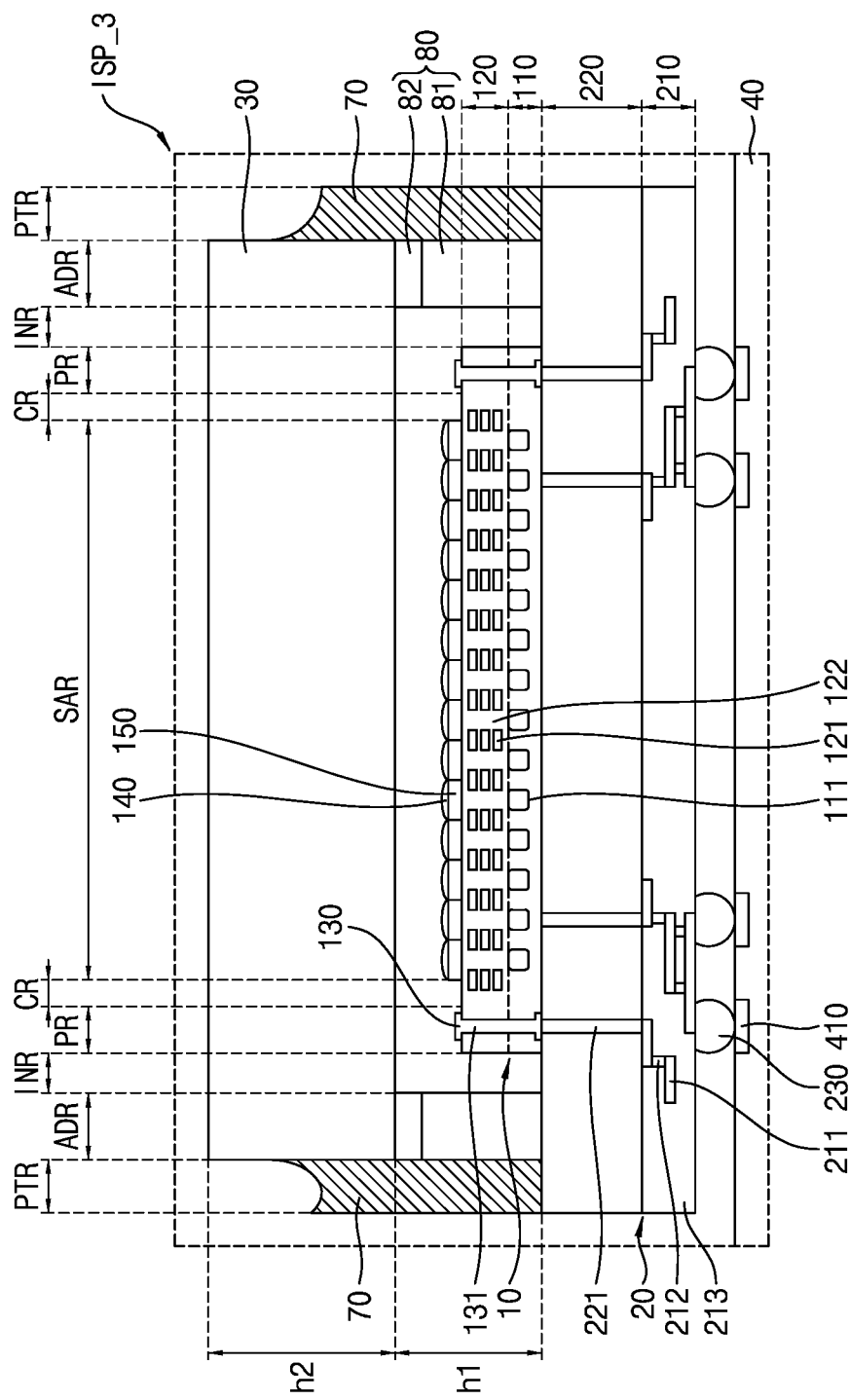

Referring to FIG. 14, an image sensor package ISP_3 according to the illustrated exemplary embodiment of the disclosure differs from the image sensor package ISP of FIG. 3 in that an upper surface of a protective member 70 may have, at one side of the protective member 70, a height gradually decreasing in a direction receding from the glass substrate 30, whereas the upper surface of the protective member 70 may have, at the other side (e.g., at the opposite side) of the protective member 70, a height gradually decreasing in a direction receding from the glass substrate 30 to a predetermined point while gradually increasing in a direction receding from the predetermined point to the outer edge thereof.

Figure 15:
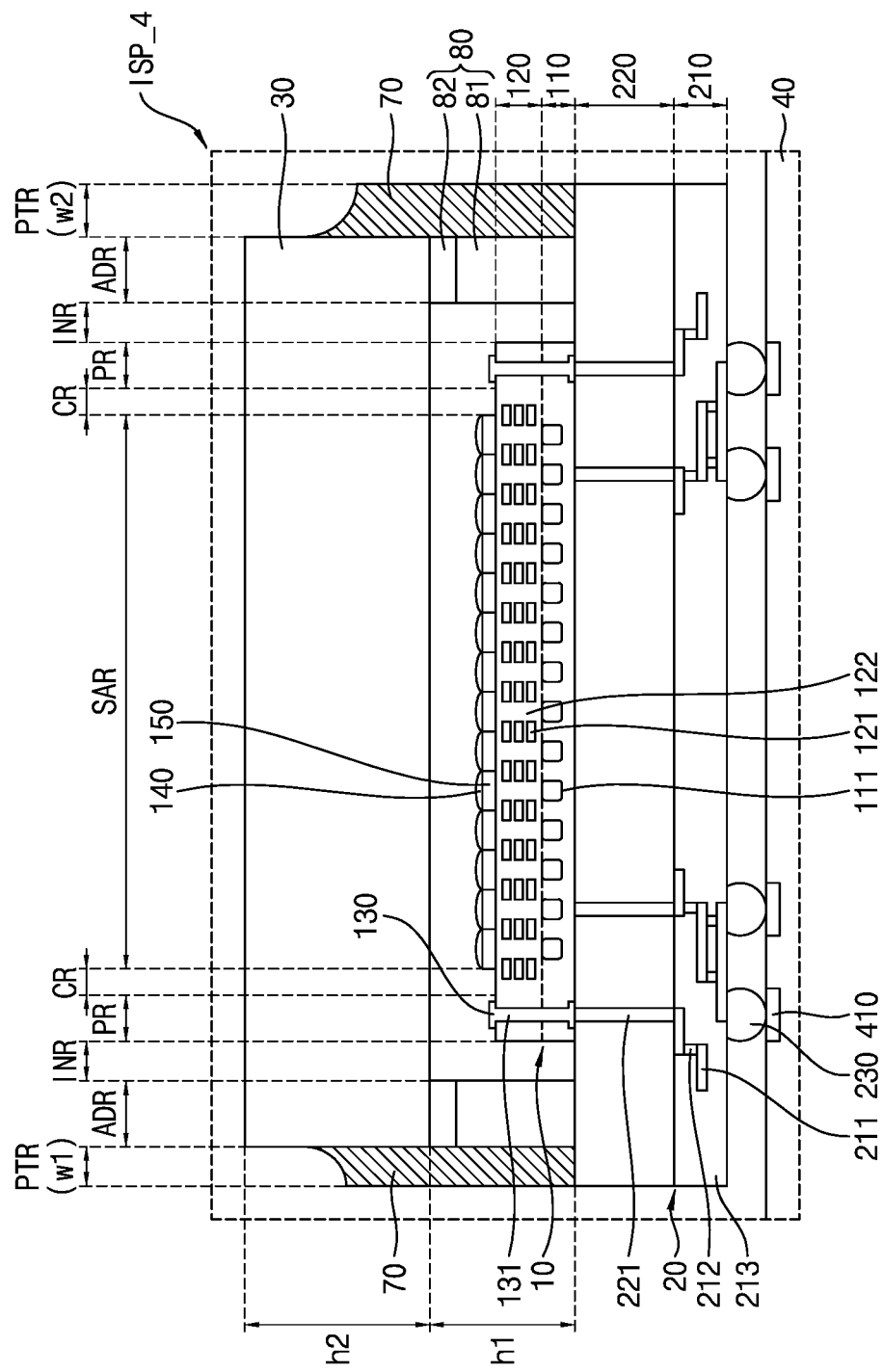

Referring to FIG. 15, an image sensor package ISP_4 according to the illustrated exemplary embodiment of the disclosure differs from the image sensor package ISP of FIG. 3 in that a protective member 70 has a width w1 at one side thereof and a width w2 at the other side (e.g., at the opposite side) thereof which differ from each other.

Figure 16:
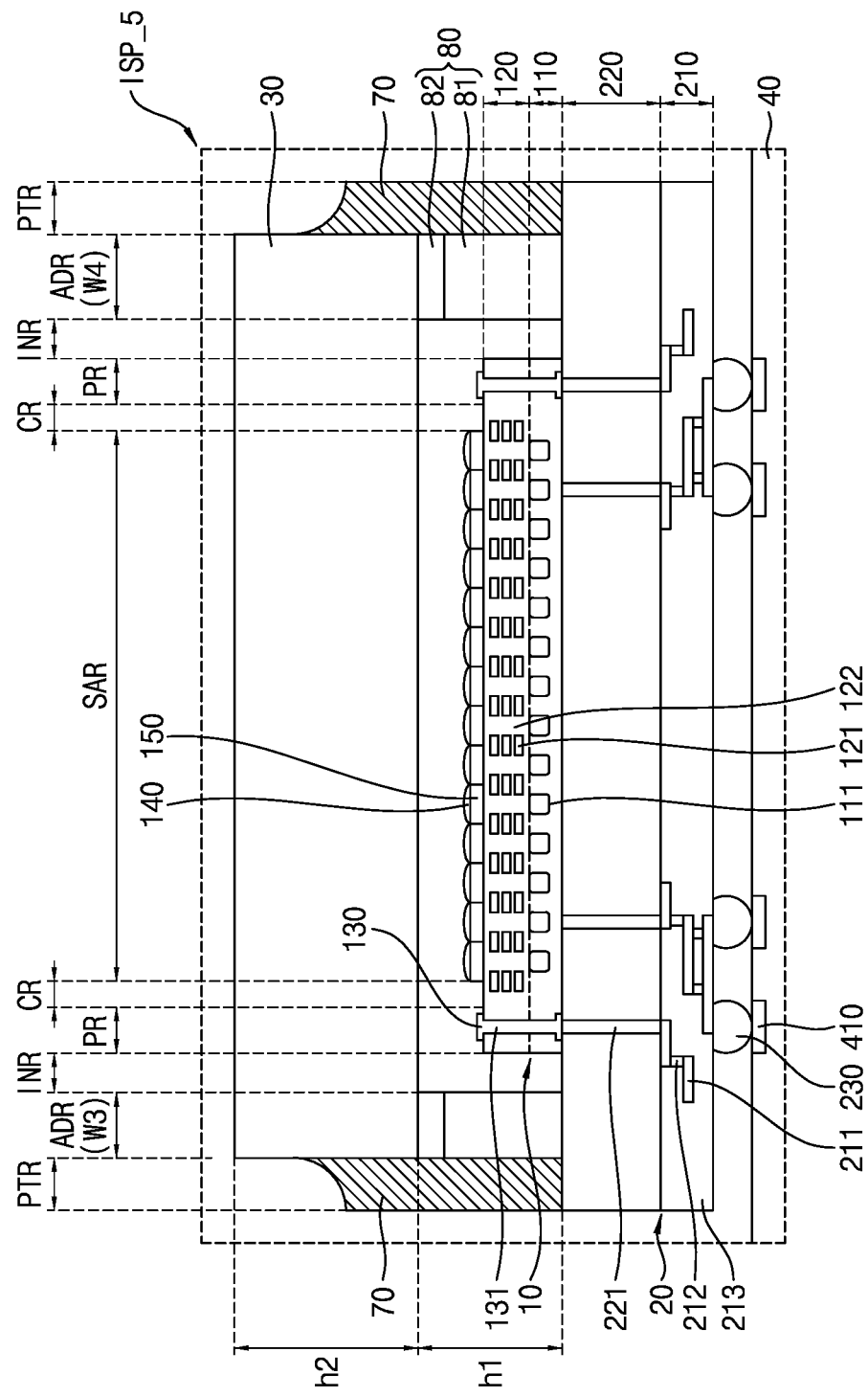

Referring to FIG. 16, an image sensor package ISP_5 according to the illustrated exemplary embodiment of the disclosure differs from the image sensor package ISP of FIG. 3 in that a sealing member 80 has a width w3 at one side thereof and a width w4 at the other side (e.g., at the opposite side) thereof which differ from each other.

Figure 17:
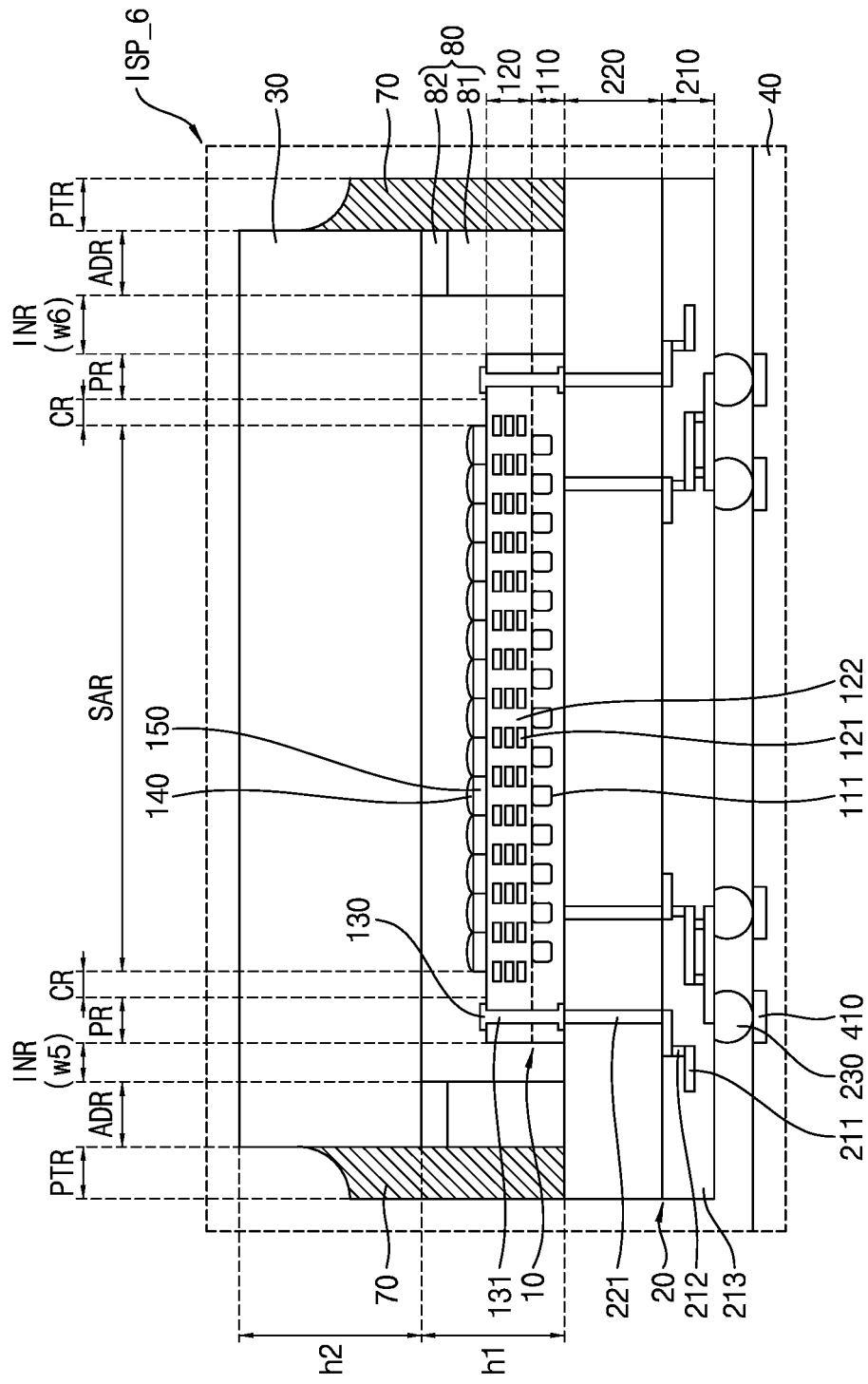

Referring to FIG. 17, an image sensor package ISP_6 according to the illustrated exemplary embodiment of the disclosure differs from the image sensor package ISP of FIG. 3 in that an inner region INR has a width w5 between one portion of a sealing region ADR and an image sensor chip 10 and a width w6 between the other portion (e.g., the opposite portion) of the sealing region ADR and the image sensor chip 10 which differ from each other. For example, distances to the sealing member 80 from the image sensor chip 10 may be different at opposite sides of the image sensor chip 10. In certain embodiments, distances to the sealing member 80 form the image sensor chip 10 may be different at all sides of the image sensor chip 10.

Figure 18:
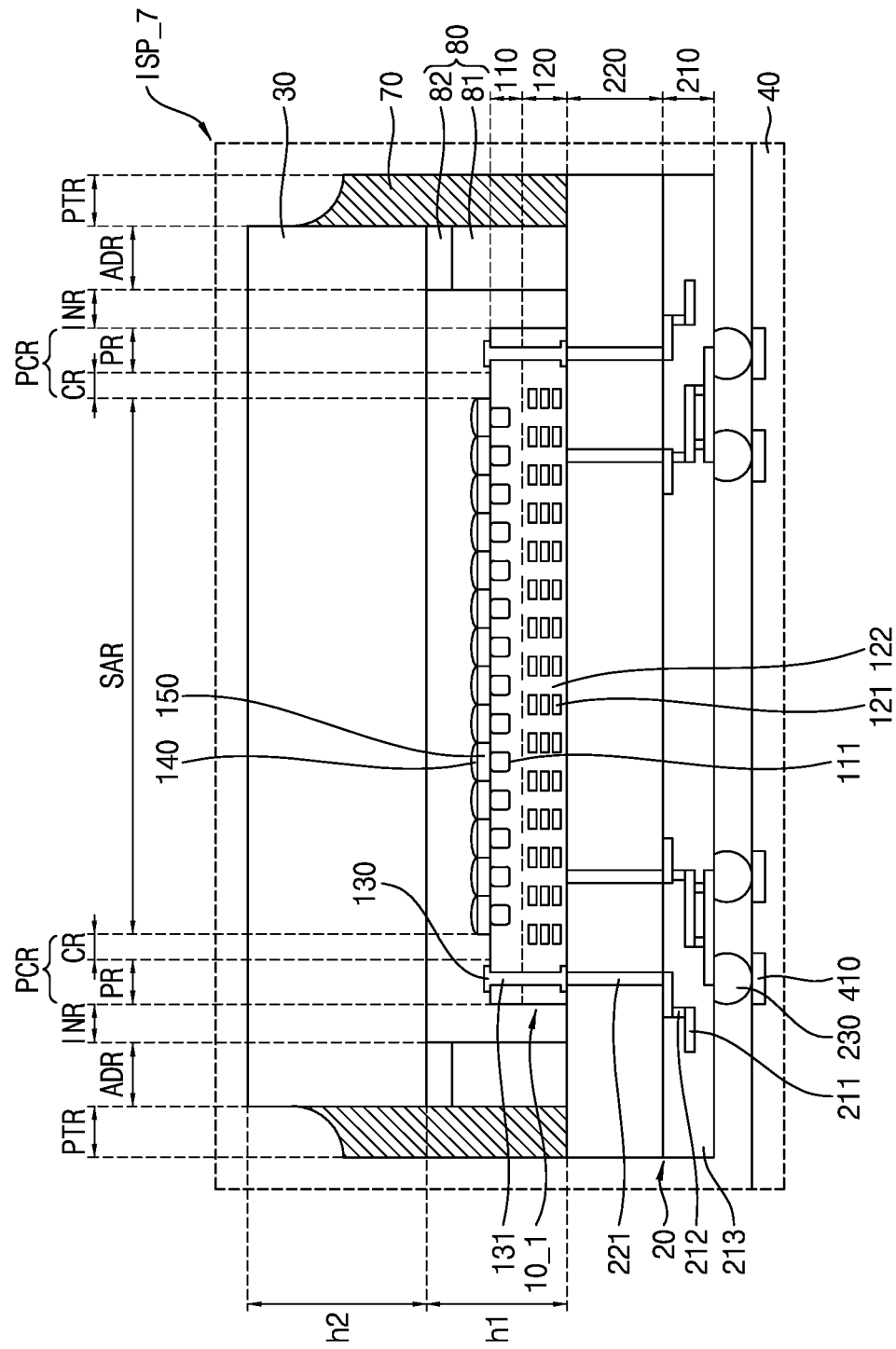

Referring to FIG. 18, an image sensor package ISP_7 according to the illustrated exemplary embodiment of the disclosure differs from the image sensor package ISP of FIG. 3 in that an image sensor chip 10_1 is embodied as a back side illumination structure. In an embodiment, the intermediate wiring layer shown in FIG. 3 may be disposed under the photoelectric transformation element layer 110. In this embodiment, the intermediate wiring layer may be referred to as a "lower wiring layer 120". For example, in an embodiment, in the image sensor chip 10_1, the photoelectric transformation element layer 110 may be disposed on the lower wiring layer 120, color filters 150 may be disposed on the photoelectric transformation element layer 110, and microlenses 140 may be disposed on the color filters 150. For example, the photoelectric transformation element layer 110 may be disposed between the lower wiring layer 120 and the color filters 150.

According to exemplary embodiments of the disclosure, an image sensor package and an image sensor module including the same may be reduced in area and thickness and, as such, signal integrity (SI) and power integrity (PI) characteristics may be enhanced.

In addition, optical losses of the image sensor package and the image sensor module may be reduced.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. An image sensor package comprising:
an image sensor chip configured to convert light collected from an outside thereof into an electrical signal;
a package substrate disposed under the image sensor chip, the package substrate configured to process the electrical signal converted from the image sensor chip;
a glass substrate disposed over the image sensor chip while being spaced apart from the image sensor chip;
a seal pattern disposed between an upper surface of the package substrate and a lower surface of the glass substrate while surrounding the image sensor chip; and
a protection pattern disposed on the package substrate outside the seal pattern, the protection pattern comprising a single-component material,
wherein the seal pattern comprises a material different from the material of the protection pattern, and
wherein an upper surface of the protection pattern is curved.

2. The image sensor package of claim 1, wherein the protection pattern surrounds the glass substrate and contacts side surfaces of the glass substrate.

3. The image sensor package of claim 2, wherein the protection pattern has a maximum height higher than a height of the lower surface of the glass substrate, but lower than a height of an upper surface of the glass substrate with reference to the upper surface of the package substrate.

4. The image sensor package of claim 3, wherein:
the seal pattern has a thickness of 10 to 50 μm and a width of 30 to 70 μm; and
the glass substrate has a thickness of 300 to 1,000 μm.

5. The image sensor package of claim 1, wherein a height of the upper surface of the protection pattern decreases gradually in a direction receding from the glass substrate.

6. The image sensor package of claim 1, wherein the protection pattern comprises a thermosetting resin.

7. The image sensor package of claim 6, wherein the protection pattern has capillary characteristics.

8. The image sensor package of claim 1, wherein:
the seal pattern comprises
a first sub-pattern disposed on the package substrate, the first sub-pattern having adhesiveness, and
a second sub-pattern disposed on the first sub-pattern, the second sub-pattern comprising a metal;
wherein the first sub-pattern contacts the upper surface of the package substrate; and
wherein the second sub-pattern contacts the lower surface of the glass substrate.

9. The image sensor package of claim 1, wherein the package substrate comprises a wiring structure layer comprising a plurality of through-silicon via (TSV) contacts vertically extending in the wiring structure layer.

10. The image sensor package of claim 9, wherein the package substrate further comprises a re-distribution layer disposed under the wiring structure layer, the re-distribution layer comprising a plurality of re-distribution lines, and re-distribution vias vertically connecting the re-distribution lines.

11. The image sensor package of claim 10, further comprising:
a plurality of bumps disposed under the re-distribution layer.

12. The image sensor package of claim 1, wherein the package substrate and the image sensor chip are arranged in a vertical direction.

13. The image sensor package of claim 1, wherein the image sensor chip comprises:
a lower wiring layer comprising a wiring structure;
a photoelectric transformation element layer disposed on the lower wiring layer, the photoelectric transformation element layer comprising a photoelectric transformation element;
a plurality of color filters disposed on the photoelectric transformation element layer; and
a plurality of microlenses disposed on the color filters, respectively.

14. The image sensor package of claim 13, wherein:
the image sensor chip further comprises
a plurality of conductive pads exposed at an upper surface of the image sensor chip, and
a plurality of through-silicon via (TSV) contacts electrically connected to the conductive pads, respectively, while extending vertically through the photoelectric transformation element layer and the lower wiring layer; and
the plurality of conductive pads and the plurality of TSV contacts are disposed outside a region where the photoelectric transformation element, the color filters and the microlenses are disposed.

15. An image sensor package comprising:
an image sensor chip configured to convert light collected from an outside thereof into an electrical signal;
a package substrate disposed under the image sensor chip and configured to process the electrical signal converted from the image sensor chip;

a glass substrate disposed over the image sensor chip while being spaced apart from the image sensor chip;
a seal pattern disposed between the package substrate and the glass substrate while surrounding the image sensor chip; and
a protection pattern disposed on the package substrate outside the seal pattern,
wherein the seal pattern comprises
   a first sub-pattern contacting the package substrate, and
   a second sub-pattern comprising a material different from a material of the first sub-pattern, the second sub-pattern contacting the glass substrate,
wherein the protection pattern has higher adhesiveness than the first sub-pattern,
wherein the first sub-pattern comprises a curable polymer having adhesiveness or an epoxy-based polymer,
wherein the second sub-pattern comprises a metal, and
wherein the protection pattern comprises a thermosetting resin.

16. The image sensor package of claim 15, wherein the second sub-pattern has a greater thickness than the first sub-pattern in a vertical direction.

17. The image sensor package of claim 15, wherein an outer edge of the protection pattern is vertically aligned with an outer edge of the package substrate.

18. An image sensor module comprising:
a base substrate;
an image sensor package disposed on the base substrate;
an optical filter disposed on the image sensor package, the optical filter comprising an infrared (IR) filter;
an optical system disposed on the optical filter, the optical system comprising a plurality of lenses;
a bracket fixing and supporting the optical filter; and
a housing fixing and supporting the optical system,
wherein the image sensor package comprises
   an image sensor chip configured to convert light collected from an outside thereof into an electrical signal,
   a package substrate disposed on the base substrate and under the image sensor chip, the package substrate configured to process the electrical signal converted from the image sensor chip,
   a glass substrate disposed on the image sensor chip and the package substrate while having a light receiving space,
   a seal pattern disposed between the package substrate and the glass substrate and surrounding the image sensor chip, and
   a protection pattern disposed on the package substrate outside the seal pattern, the protection pattern comprising a single-component material,
wherein the seal pattern comprises
   a first sub-pattern contacting the package substrate, and
   a second sub-pattern comprising a material different from a material of the first sub-pattern, the second sub-pattern contacting the glass substrate, and
wherein the seal pattern comprises a material different from the material of the protection pattern.

\* \* \* \* \*